US012692604B2

(12) United States Patent
Lee et al.

(10) Patent No.: US 12,692,604 B2
(45) Date of Patent: Jul. 28, 2026

(54) PREPARING METHOD OF TWO-DIMENSIONAL MATERIALS WITH CONTROLLED NUMBER OF LAYERS

(71) Applicant: AJOU UNIVERSITY INDUSTRY-ACADEMIC COOPERATION FOUNDATION, Suwon-si (KR)

(72) Inventors: Jaehyun Lee, Bucheon-si (KR); Jiyun Moon, Yongin-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 680 days.

(21) Appl. No.: 18/164,874

(22) Filed: Feb. 6, 2023

(65) Prior Publication Data

US 2023/0250533 A1      Aug. 10, 2023

(30) Foreign Application Priority Data

Feb. 10, 2022      (KR) ........................ 10-2022-0017636

(51) Int. Cl.
| | |
|---|---|
| *C23C 16/50* | (2006.01) |
| *C23C 14/06* | (2006.01) |
| *C23C 14/58* | (2006.01) |
| *C23C 16/52* | (2006.01) |
| *C23C 16/56* | (2006.01) |
| *C23C 14/24* | (2006.01) |
| *C23C 14/34* | (2006.01) |

(52) U.S. Cl.
CPC .......... *C23C 16/50* (2013.01); *C23C 14/0623* (2013.01); *C23C 14/0635* (2013.01); *C23C 14/5806* (2013.01); *C23C 16/52* (2013.01); *C23C 16/56* (2013.01); *C23C 14/24* (2013.01); *C23C 14/3464* (2013.01)

(58) Field of Classification Search
CPC ................................ C23C 16/56; C23C 16/52
See application file for complete search history.

(56) References Cited

U.S. PATENT DOCUMENTS

| | | | |
|---|---|---|---|
| 2021/0351033 A1* | 11/2021 | Kim ...................... | B32B 37/025 |
| 2022/0033265 A1* | 2/2022 | Lee ........................ | C01G 39/06 |

FOREIGN PATENT DOCUMENTS

| | | |
|---|---|---|
| KR | 10-2017-0021297 A | 2/2017 |
| KR | 10-1795969 B1 | 11/2017 |
| KR | 10-2020-0043721 A | 4/2020 |
| KR | 10-2165558 B1 | 10/2020 |
| KR | 10-2021-0080440 A | 6/2021 |
| KR | 10-2022-0014995 A | 2/2022 |
| WO | 2015/036928 A2 | 3/2015 |
| WO | 2019/089793 A1 | 5/2019 |

* cited by examiner

*Primary Examiner* — Joseph A Miller, Jr.
(74) *Attorney, Agent, or Firm* — Sughrue Mion, PLLC

(57) ABSTRACT

The present disclosure relates to a preparing method of two-dimensional materials with a controlled number of layer including depositing a metal thin film on a surface of a bulk material; exfoliating a two-dimensional material from the surface of the bulk material together with the metal thin film; and transferring the two-dimensional material onto a substrate, in which the number of layers of the two-dimensional material to be exploited is controlled by controlling an internal stress of the metal thin film.

9 Claims, 15 Drawing Sheets
(5 of 15 Drawing Sheet(s) Filed in Color)

EXAMPLE 1-1    EXAMPLE 1-2    EXAMPLE 1-3    EXAMPLE 1-4    EXAMPLE 1-5

EXAMPLE 2-1          EXAMPLE 2-2          EXAMPLE 2-3

EXAMPLE 3-1                EXAMPLE 3-2                EXAMPLE 3-3

1<sup>st</sup>quadrant       2<sup>nd</sup>quadrant       3<sup>rd</sup>quadrant       4<sup>th</sup>quadrant

PREPARING METHOD OF TWO-DIMENSIONAL MATERIALS WITH CONTROLLED NUMBER OF LAYERS

CROSS-REFERENCE TO RELATED APPLICATION

This application is based on and claims priority under 35 U.S.C. § 119 to Korean Patent Application No. 10-2022-0017636, filed on Feb. 10, 2022 in the Korean Intellectual Property Office, the disclosures of which are herein incorporated by reference in their entireties.

FIELD

The present disclosure relates to a preparing method of two-dimensional materials with a controlled number of layers.

DESCRIPTION OF THE RELATED ART

A van der Waals heterostructure which is implemented by reassembling two-dimensional materials with a weak van der Waals force is currently receiving explosive attention as a next generation electronic material which enables a paradigm for Si-based electronic devices. In particular, among various two-dimensional materials, transition metal dichalcogenides (TMDC) are considered as active layers essential for future nanoelectronic devices based on van der Waals heterostructures due to their excellent electrical, optical, and thermal properties.

Unlike a general three-dimensional semiconductor, the electronic structure of the TMDC greatly changes according to the number of layers within a thickness of several nanometers and for this reason, various methods have been devised to control the number of layers of the two-dimensional material. Among various synthetic methods, chemical vapor deposition (CVD) which first introduced in 2009 for the synthesis of large-area single layer graphene has been considered as an appropriate means for synthesizing the large-area and high-quality TMDC. However, the CVD, which is a bottom-up synthetic method, has a problem in that the number of TMDC layers cannot be accurately controlled in the large area so far due to the limitations of the non-catalytic growth model.

In order to solve the problem of the bottom-up synthetic method, the top-down exfoliation has begun to be considered as an alternative technology to ensure high quality and large area two-dimensional materials, but this method still has a limitation of isolating only the top single layer TMDC.

Accordingly, it is necessary to develop a preparing method which is capable of precisely controlling the number of layers of high quality two-dimensional materials in a large area.

Korean Registered Patent No. 10-1795969 discloses Exfoliated layer structure materials and the method of exfoliating the same. Specifically, the patent discloses a method of exfoliating transition metal dichalcogenide into a single layered structure material using functional dextran in which a functional group is introduced into dextran, which is a hydrophilic polymer, but a method for preparing the transition metal dichalcogenide to have a plurality of layers, as well as a single layer has not been disclosed.

CONTENT OF THE INVENTION

Problem to be Solved

The present disclosure has been made an effort to solve the problem of the related art and provides a preparing method of two-dimensional materials with a controlled number of layers.

Further, a two-dimensional material with a controlled number of layers prepared by the preparing method is provided.

Further, a heterojunction structure of a two-dimensional material including a two-dimensional material with a controlled number of layers is provided.

Further, a photo detector device including the heterojunction structure of a two-dimensional material is provided.

However, objects to be achieved by various embodiments of the present disclosure are not limited to the technical objects as described above and other technical objects may be present.

Problem Solving Means

As a technical means to achieve the above-described technical object, according to a first aspect of the present disclosure, a preparing method of a two-dimensional material with a controlled number of layers includes: depositing a metal thin film on a surface of a bulk material; exfoliating a two-dimensional material from the surface of the bulk material together with the metal thin film; and transferring the two-dimensional material onto a substrate, and the number of layers of the two-dimensional material to be exploited is controlled by controlling an internal stress of the metal thin film.

According to an embodiment of the present disclosure, as the internal stress of the metal thin film is reduced, the number of layers of the two-dimensional material to be exfoliated may be increased, but is not limited thereto.

According to an embodiment of the present disclosure, the internal stress $\sigma_f$ of the metal thin film is represented by the following Equation 1. When a total accumulated strain energy $U_{Total}$ represented by the following Equation 2 reaches a binding energy $\gamma$ of the two-dimensional material, the two-dimensional material is exfoliated, but it is not limited thereto.

$$\sigma_f = \sqrt{\frac{\gamma}{U_{Total}}} \qquad \text{[Equation 1]}$$

(In Equation 1, $\gamma$ is a binding energy of a two-dimensional material and $U_{Total}$ is a total accumulated strain energy)

$$U_{Total} = \frac{(1-v_f)}{2Y_f} t_f \sigma_f^2 + \\ \frac{(1-v_s)}{2Y_s} \frac{t_f^2}{t_s} \sigma_f^2 \left[ 12\left(\frac{d_{spall}}{t_s}\right)^3 - 24\left(\frac{d_{spall}}{t_s}\right)^2 + 16\left(\frac{d_{spall}}{t_s}\right) \right] \qquad \text{[Equation 2]}$$

(In Equation 2, $v_s$ and $v_f$ are Poisson's ratios of a bulk material and a metal thin film, respectively, $Y_s$ and $Y_f$ are Young's modulus of a bulk material and a metal thin film, respectively, $t_s$ and $t_f$ are thicknesses of a bulk material and a metal thin film, respectively, and $d_{spall}$ is a spall depth).

According to the implementation example of the present disclosure, a step of removing the metal thin film is further included, but is not limited thereto.

According to the implementation example of the present disclosure, the step of removing the metal thin film is performed by impregnating the metal thin film in a metal etchant, but is not limited thereto.

According to one implementation example of the present disclosure, the step of depositing the metal thin film may be performed by a method selected from the group consisting of E-beam evaporation, thermal evaporation, vacuum thermal evaporation, plasma deposition, sputtering, atomic layer deposition (ALD), chemical vapor deposition (CVD), physical vapor deposition (PVD), and combinations thereof, but is not limited thereto.

According to the implementation example of the present disclosure, the metal may include one selected from the group consisting of Ag, Au, Cu, Pd, and combinations thereof, but is not limited thereto.

According to the implementation example of the present disclosure, the two-dimensional material may include one selected from the group consisting of transition metal chalcogenide, graphene, fluorographene, graphene oxide, hexagonal boron nitride (h-BN), boron carbon nitride (BCN), black phosphorus, and combinations thereof, but is not limited thereto.

According to the implementation example of the present disclosure, transition metal chalcogenide includes a material denoted by the following Chemical Formula 1, but is not limited thereto.

$$MX_2 \qquad \text{Chemical Formula 1}$$

(In the above Chemical Formula 1, M is a transition metal selected from Mo, W, Te, Re, V, Nb, Ta, Ti, Zr, Hf, Co, Rh, Ir, Ni, Pd, or Pt and X is a chalcogenide element selected from S, Se, or Te).

According to the implementation example of the present disclosure, the exfoliation may be performed using a thermal release tape (TRT), but is not limited thereto.

Further, according to a second aspect of the present disclosure, a two-dimensional material with a controlled number of layers which is prepared by the preparing method according to the first aspect of the present disclosure is provided.

Further, a third aspect of the present disclosure provides a heterojunction structure of a two-dimensional material including: a pair of two-dimensional materials; and a two-dimensional material with a controlled number of layers according to the second aspect of the present disclosure, and the two-dimensional material with a controlled number of layers is disposed in an intermediate layer of the pair of two-dimensional materials.

Further, a fourth aspect of the present disclosure provides a photo detector device including the heterojunction structure of a two-dimensional material according to the third aspect of the present disclosure.

The above-described solving means are merely illustrative but should not be construed as limiting the present disclosure. In addition to the above-described embodiments, additional embodiments may be further provided in the drawings and the detailed description of the present disclosure.

Effects of the Invention

A preparing method of a two-dimensional material with a controlled number of layers according to the present disclosure precisely controls a depth of exfoliation within a range of less than nanometer by adjusting an internal stress of a metal thin film deposited on a bulk material, thereby adjusting the number of layers of the exfoliated two-dimensional material and preparing a two-dimensional material having a desired number of layers, such as a single layer, a double layer, or a triple layer.

Specifically, the internal stress of the metal thin film may be controlled by adjusting a thickness of a metal thin film to be deposited and a total stress release time during a deposition process. As the internal stress of the metal thin film is reduced, the number of layers of the two-dimensional material to be exfoliated is increased.

Further, the preparing method of a two-dimensional material with a controlled number of layers according to the present disclosure does not cause a physical defect such as tearing or bending and a chemical contaminant remaining on a surface, so that a high quality two-dimensional material with a controlled number of layers with a clean surface may be prepared. The two-dimensional material with the controlled number of layers which is clean and does not have defect is laminated with different two-dimensional materials to advantageously configure the van der Waals heterostructure.

However, the effect which can be achieved by the present disclosure is not limited to the above-described effects, there may be another effects.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
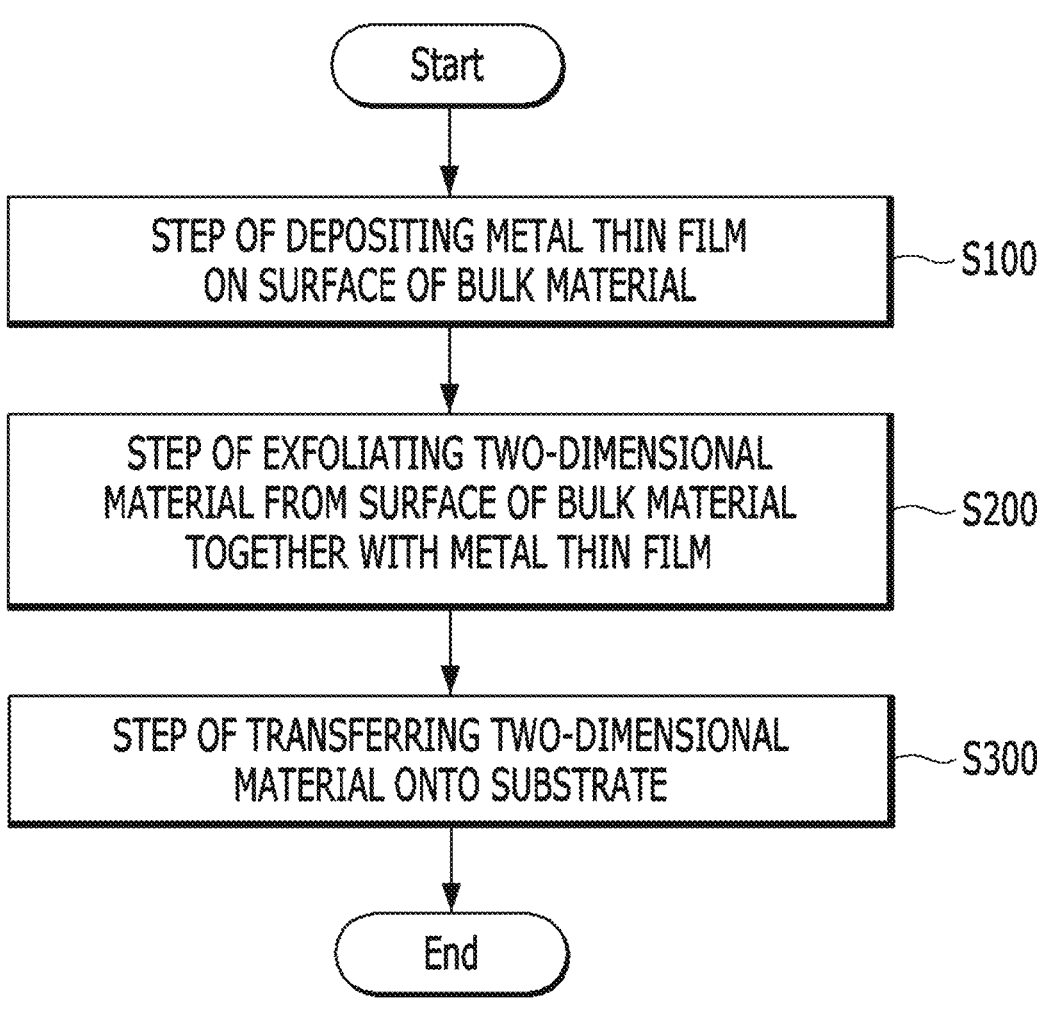
FIG. 1 is a flowchart of a preparing method of a two-dimensional material with a controlled number of layers according to an implementation example of the present disclosure.

Hereinafter, the present disclosure will be described more fully hereinafter with reference to the accompanying drawings, in which exemplary embodiments of the present disclosure are shown. However, the present disclosure can be realized in various different forms, and is not limited to the embodiments described herein. Accordingly, in order to clearly explain the present disclosure in the drawings, portions not related to the description are omitted. Like reference numerals designate like elements throughout the specification.

Throughout this specification and the claims that follow, when it is described that an element is "coupled" to another element, the element may be "directly coupled" to the other element or "electrically coupled" to the other element with a third element therebetween.

Throughout the specification of the present disclosure, when one member is located "on", "above", "on an upper portion", "below", "under", and "on a lower portion" of the other member, the member may be adjacent to the other member or a third member may be disposed between the above two members.

Throughout the specification of the present disclosure, unless explicitly described to the contrary, the word "comprise" and variations such as "comprises" or "comprising", will be understood to imply the inclusion of stated elements but not the exclusion of any other elements.

The terms "about or approximately" or "substantially" indicating a degree used throughout the specification are used as a numerical value or a meaning close to the numerical value when a unique manufacturing and material tolerance is proposed to the mentioned meaning and also used to prevent unscrupulous infringers from wrongfully using the disclosure in which precise or absolute numerical values are mentioned for better understanding of the present disclosure. Terms used throughout the specification, "~step ~ing" or "step of~" do not mean "step for~".

Throughout the specification of the present disclosure, the term "combination thereof" included in the expression of Markushi format refers to a mixture or a combination of one or more selected from the group consisting of components described in the expression of the Markushi format and it means that one or more selected from the group consisting of the components is included.

Throughout the specification of the present disclosure, the description of "A and/or B" refers to "A, B, or, A and B".

Hereinafter, a preparing method of a two-dimensional material with a controlled number of layers of the present disclosure will be described in detail with reference to implementation examples, exemplary embodiments, and drawings. However, the present disclosure is not limited to the implementation examples, the embodiments, and the drawings.

As a technical means to achieve the above-described technical object, according to a first aspect of the present disclosure, a preparing method of a two-dimensional material with a controlled number of layers includes: depositing a metal thin film on a surface of a bulk material; exfoliating a two-dimensional material from the surface of the bulk material together with the metal thin film; and transferring the two-dimensional material onto a substrate, the number of layers of the two-dimensional material to be exploited is controlled by controlling an internal stress of the metal thin film.

A preparing method of a two-dimensional material with a controlled number of layers according to the present disclosure precisely controls a depth of exfoliation within a range of less than nanometer by adjusting an internal stress of a metal thin film deposited on a bulk material, thereby adjusting the number of layers of the exfoliated two-dimensional material and preparing a two-dimensional material having a desired number of layers, such as a single layer, a double layer, or a triple layer.

Specifically, the internal stress of the metal thin film may be controlled by adjusting a thickness of metal thin film to be deposited and a total stress release time during a deposition process. The smaller the internal stress of the metal thin film, the larger the number of layers of the exfoliated two-dimensional material.

Further, the preparing method of a two-dimensional material with a controlled number of layers according to the present disclosure does not cause a physical defect such as tearing or bending and a chemical contaminant remaining on a surface, but may prepare a high quality two-dimensional material with a controlled number of layers with a clean surface. The two-dimensional material with the controlled number of layers which is clean and does not have defect is laminated with different two-dimensional material to advantageously configure the van der Waals heterostructure.

FIG. 1 is a flowchart of a preparing method of a two-dimensional material with a controlled number of layers according to an implementation example of the present disclosure.

First, a metal thin film is deposited on a surface of a bulk material (S100).

During the deposition process of the metal thin film, a total stress release time is adjusted to control an internal stress of the metal thin film, and the number of layers of the two-dimensional material to be exfoliated may be controlled according to the internal stress of the metal thin film.

Specifically, the total stress release time is calculated by a product of a stress release time and an interval during the deposition process and the stress release time and the interval during the deposition process are controlled to adjust the total stress release time. In the metal thin films with the same thickness, as the total stress release time is increased, the internal stress of the metal thin film may be reduced.

Further, the internal stress of the metal thin film may be controlled by adjusting a deposition thickness of the metal thin film. For example, when the thickness of the metal thin film is increased, the internal stress of the metal thin film may be reduced, but is not limited thereto.

According to one implementation example of the present disclosure, the step of depositing a metal thin film may be performed by a method selected from the group consisting of E-beam evaporation, thermal evaporation, vacuum thermal evaporation, plasma deposition, sputtering, atomic layer deposition (ALD), chemical vapor deposition (CVD), physical vapor deposition (PVD), and combinations thereof, but is not limited thereto.

According to the implementation example of the present disclosure, the metal may include one selected from the group consisting of Ag, Au, Cu, Pd, and combinations thereof, but is not limited thereto.

A polymer layer may be additionally formed on the metal thin film, but is not limited thereto.

Even though the polymer layer is not formed, the exfoliation is possible, but the two-dimensional material may be protected from physical bindings generated during the process, by means of the process of additionally forming the polymer layer.

Next, the two-dimensional material is exfoliated from the surface of the bulk material together with the metal thin film (S200).

According to the implementation example of the present disclosure, as the internal stress of the metal thin film is reduced, the number of layers of the two-dimensional material to be exfoliated may be increased, but is not limited thereto.

Figure 2:
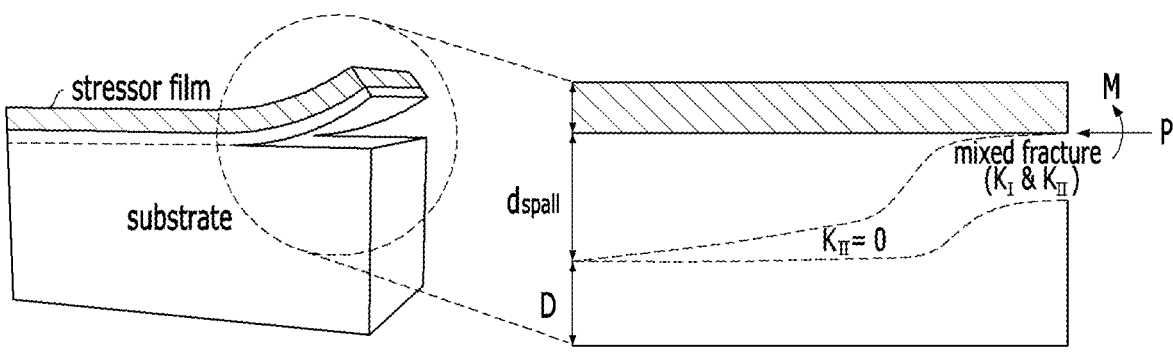
FIG. 2 is a diagram illustrating exfoliation of a surface layer of a bulk material according to an implementation example of the present disclosure.

FIG. 2 is a diagram illustrating exfoliation of a surface layer of a bulk material according to an implementation example of the present disclosure. With regard to this, P, M, $t_f$, $d_{spall}$, and D refer to an edge load, a moment induced by the metal thin film, a thickness of the metal thin film, a spall propagation depth, and a thickness of a bulk material after being exfoliated, respectively.

An exfoliation thickness of the two-dimensional material by the metal thin film may be predicted based on Suo-Hutchinson model (S-H model). In the S-H model, KI representing a vertical stress and KII representing a parallel stress are considered as a stress intensity factor (SIF). Hereinafter, for the convenience of description, KI and KII are named mode I and mode II, respectively.

Referring to FIG. 2, when a stress is applied to the metal thin film from the outside, a substrate on the bottom, that is, the bulk material is spalled and for a predetermined period of time from the time when the spall first starts, mode I and mode II complexly act so that the spall downwardly moves. Thereafter, at the moment when the mode II is 0, the spall does not move downwardly, but moves in a direction parallel to the substrate. That is, a location where mode II is 0 is the number of layers of a two-dimensional material to be exfoliated. A time when mode II is 0 is adjusted by controlling a thickness of the metal thin film and the internal stress. As described above, when the internal stress of the metal thin film is adjusted, the location where mode II becomes 0 is also adjustable so that the number of layers of the two-dimensional material to be exfoliated may be controlled.

In the following experimental example, it was confirmed that even though the thickness of the metal thin film was the same, as the internal stress was reduced, a thicker two-dimensional material was exfoliated and in contrast, as the internal stress was increased, the thinner two-dimensional material was exfoliated.

According to one implementation example of the present disclosure, the internal stress $\sigma_f$ of the metal thin film is represented by the following Equation 1. When a total accumulated strain energy $U_{Total}$ represented by the following Equation 2 reaches a binding energy $\gamma$ of the two-dimensional material, the two-dimensional material is exfoliated, but it is not limited thereto.

$$\sigma_f = \sqrt{\frac{\gamma}{U_{Total}}} \qquad \text{[Equation 1]}$$

(In Equation 1, $\gamma$ is a binding energy of a two-dimensional material and $U_{Total}$ is a total accumulated strain energy)

$$U_{Total} = \frac{(1-v_f)}{2Y_f} t_f \sigma_f^2 + \frac{(1-v_s)}{2Y_s} \frac{t_f^2}{t_s} \sigma_f^2 \left[ 12 \left( \frac{d_{spall}}{t_s} \right)^3 - 24 \left( \frac{d_{spall}}{t_s} \right)^2 + 16 \left( \frac{d_{spall}}{t_s} \right) \right] \qquad \text{[Equation 2]}$$

(In Equation 2, $v_s$ and $v_f$ are Poisson's ratios of a bulk material and a metal thin film, respectively, $Y_s$ and $Y_f$ are Young's modulus of a bulk material and a metal thin film, respectively, $t_s$ and $t_f$ are thicknesses of a bulk material and a metal thin film, respectively, and $d_{spall}$ is a spall depth).

In Equation 2, $d_{spall}$ is a spall depth and is represented by the following Equation 3.

$$d_{spall} = \left[ \frac{\tan(\omega)}{\sqrt{3} - \tan(\omega)} \right] t_f \qquad \text{[Equation 3]}$$

In Equation 3, when $\omega$ is 52.07°, it satisfies a planar strain condition so that $d_{spall}$ is represented by $2.86 t_f$.

Through Equations 1 and 2, it is possible to theoretically express that an exfoliation thickness may be controlled according to internal stress and in the following description, the deducing process of Equations 1 and 2 will be described in detail.

Figure 3:
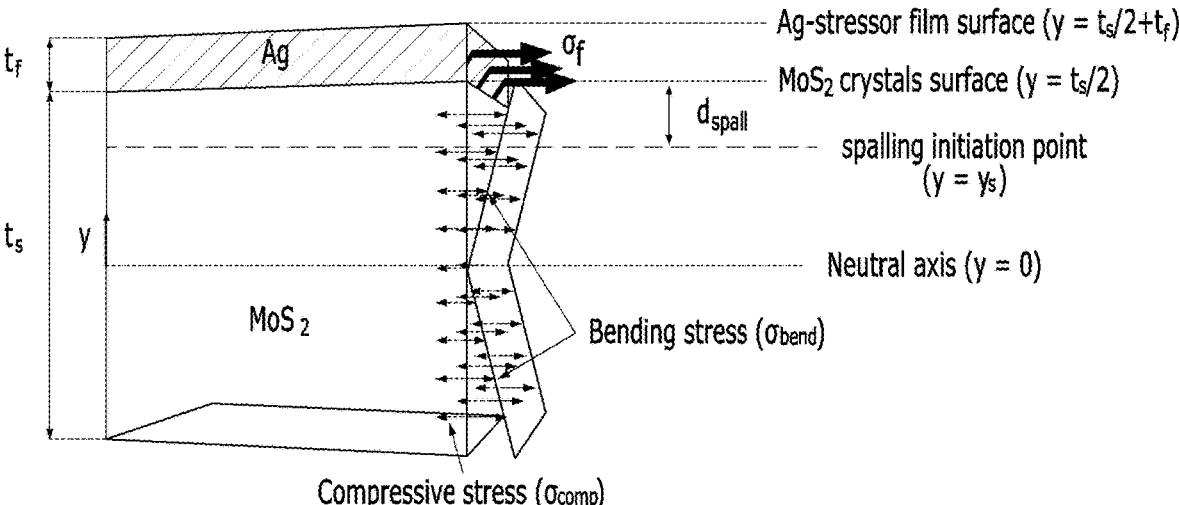
FIG. 3 is a diagram of a magnitude and a direction of a stress induced from a metal thin film/bulk material structure according to an implementation example of the present disclosure.

FIG. 3 is a diagram of a magnitude and a direction of a stress induced from a metal thin film/bulk material structure according to an implementation example of the present disclosure.

Referring to FIG. 3, in order to predict the spall depth (that is, the exfoliation thickness) according to the internal stress of the metal thin film, a total accumulated strain energy $U_{Total}$ applied to a system as illustrated in FIG. 3 needs to be deduced. At this time, $U_{Total}$ is represented by a sum of the strain energy $\sigma_f$ by the metal thin film and the strain energy $U_s$ generated in the lower bulk material by the metal thin film.

The strain energy $U_f$ by the metal thin film and the strain energy $U_s$ generated in the lower bulk material by the metal thin film are represented by the following Equations 4 and 5, respectively.

$$U_f = \frac{1}{2}\int_{\frac{t_s}{2}}^{\frac{t_s}{2}+t_f} \varepsilon_f \sigma_f dy = \frac{(1-\nu_f)}{2Y_f} t_f \sigma_f^2 \qquad \text{[Equation 4]}$$

(In Equation, $t_s$ and $t_f$ are thicknesses of the bulk material and the metal thin film, $\varepsilon_f$ is an elastic strain of the metal thin film, $\sigma_f$ is an internal stress of the metal thin film, y is a thickness from a neutral axis, $\nu_f$ is a Poisson's ratio of the metal thin film, and $Y_f$ is a Young's modulus of the metal thin film.)

$$U_s = \frac{(1-\nu_s)}{2Y_s}\frac{t_f^2}{t_s}\sigma_f^2\left[\frac{7}{2} - 12\left(\frac{y_s}{t_s}\right)^3 - 6\left(\frac{y_s}{t_s}\right)^2 - \left(\frac{y_s}{t_s}\right)\right] \qquad \text{[Equation 5]}$$

(In Equation, $\nu_s$ is a Poisson's ratio of the bulk material, $Y_s$ is a Young's modulus of the bulk material, $t_s$ and $t_f$ are thicknesses of the bulk material and the metal thin film, $\sigma_f$ is an internal stress of the metal thin film, and $y_s$ is a point that the exfoliation begins).

In Equation 5, $y_s$ is a point that the exfoliation begins, which is represented by the following Equation 6.

$$y_s = \frac{t_s}{2} - d_{spall} \qquad \text{[Equation 6]}$$

(In Equation, $t_s$ is a thickness of the bulk material and $d_{spall}$ is a spall depth).

Consequently, the total accumulated strain energy $U_{Total}$ which is a value obtained by adding the strain energy $U_f$ by the metal thin film and the strain energy $U_s$ generated in the bulk material by the metal thin film is represented by the above Equation 2 and a correlation of the internal stress of the metal thin film and the exfoliation thickness is represented by Equation 1.

According to the implementation example of the present disclosure, the exfoliation may be performed using a thermal release tape (TRT), but is not limited thereto.

According to the implementation example of the present disclosure, the two-dimensional material may include one selected from the group consisting of transition metal chalcogenide, graphene, fluorographene, graphene oxide, hexagonal boron nitride (h-BN), boron carbon nitride (BCN), black phosphorus, and combinations thereof, but is not limited thereto.

According to the implementation example of the present disclosure, the transition metal chalcogenide includes a material denoted by the following Chemical Formula 1, but is not limited thereto.

$$MX_2 \qquad \text{Chemical Formula 1}$$

(In the above Chemical Formula 1, M is a transition metal selected from Mo, W, Te, Re, V, Nb, Ta, Ti, Zr, Hf, Co, Rh, Ir, Ni, Pd, or Pt and X is a chalcogenide element selected from S, Se, or Te).

Next, the two-dimensional material is transferred onto a substrate (S300).

The two-dimensional material exfoliated from the bulk material is transferred onto a desired substrate suitable for a use and a purpose to be used.

According to the implementation example of the present disclosure, a step of removing the metal thin film is further included, but is not limited thereto.

The process of exfoliating the two-dimensional material is simultaneously performed with the metal thin film so that the metal thin film still remains on the two-dimensional material after the exfoliation. Therefore, in order to obtain only the two-dimensional material, a process of removing the metal thin film may be additionally performed.

According to the implementation example of the present disclosure, the step of removing the metal thin film is performed by impregnating the metal thin film in a metal etchant, but is not limited thereto.

As described above, in the step S100 of depositing the metal thin film on a surface of the bulk material, a polymer layer may be further formed on the metal thin film, and by doing this, a process of impregnating it into acetone may be further performed to remove the polymer layer, but is not limited thereto.

Further, according to a second aspect of the present disclosure, a two-dimensional material with a controlled number of layers which is prepared by the preparing method according to the first aspect of the present disclosure is provided.

A detailed description of repeated parts of the two-dimensional material with a controlled number of layers according to the second aspect of the present disclosure with the first aspect of the present disclosure will be omitted. However, even though the detailed description thereof is omitted, the description of the first aspect of the present disclosure may be applied to the second aspect of the present disclosure in the same manner.

Further, a third aspect of the present disclosure provides a heterojunction structure of a two-dimensional material including: a pair of two-dimensional materials; and a two-dimensional material with a controlled number of layers according to the second aspect of the present disclosure, and the two-dimensional material with a controlled number of layers is disposed in an intermediate layer of the pair of two-dimensional materials.

A detailed description of repeated parts of the heterojunction structure of a two-dimensional material according to the third aspect of the present disclosure with the second aspect of the present disclosure will be omitted. However, even though the detailed description thereof is omitted, the description of the second aspect of the present disclosure may be applied to the third aspect of the present disclosure in the same manner.

The two-dimensional material with a controlled number of layers which is clean and is not defective is advantageous to configure a van der Waals heterostructure with various two-dimensional materials. For example, the transition metal dichalcogenide with a controlled number of layers is disposed between one pair of single layered graphene to form a heterojunction structure of two-dimensional material.

Further, a fourth aspect of the present disclosure provides a photo detector device including the heterojunction structure of a two-dimensional material according to the third aspect of the present disclosure.

A detailed description of repeated parts of the photo detector device according to the fourth aspect of the present disclosure with the third aspect of the present disclosure will be omitted. However, even though the detailed description thereof is omitted, the description of the third aspect of the present disclosure may be applied to the fourth aspect of the present disclosure in the same manner.

The above-described solving means are merely illustrative but should not be construed as limiting the present disclosure. In addition to the above-described embodiments, additional embodiments may be further provided in the drawings and the detailed description of the present disclosure.

Example 1

Prepare MoS₂ with Controlled Number of Layers

First, a spalled MoS₂ crystal was prepared by applying a thermal release tape (Revalpha 3196, Nitto Denko, TRT) to a MoS₂ crystal which was a bulk material and then carefully peeling it off. The spalled MoS₂ crystal was placed on a flat glass substrate and epoxy resin (Officeahn) was poured and then cured for 24 to 48 hours in the vacuum atmosphere.

Next, a 70 nm thick-Ag film was deposited on a surface of the spalled MoS₂ crystal in which the epoxy resin was not formed using an electron beam evaporation system (Ag/MoS₂). At this time, in order to suppress the physical damage of the MoS₂ crystal, a deposition speed was maintained at 0.1/s for 30 seconds.

In order to adjust the internal stress of the Ag thin film in the MoS₂ crystal, a total stress release time t was controlled and the internal stress of the Ag thin film was controlled through a total of five deposition conditions. In Table 1, a total stress release time t according to Example 1 of the present disclosure is represented. In the following Table 1, the total stress release time t is a product of the stress release time A and an interval B during the deposition process.

TABLE 1

| | Total stress release time (t) | Stress release time (A) | Interval during deposition process (B) |
|---|---|---|---|
| Example 1-1 | 0 min | 0 min | zero |
| Example 1-2 | 30 min | 15 min | Two times |
| Example 1-3 | 60 min | 30 min | Two times |
| Example 1-4 | 180 min | 30 min | Six times |
| Example 1-5 | 360 min | 60 min | Six times |

Figure 4:
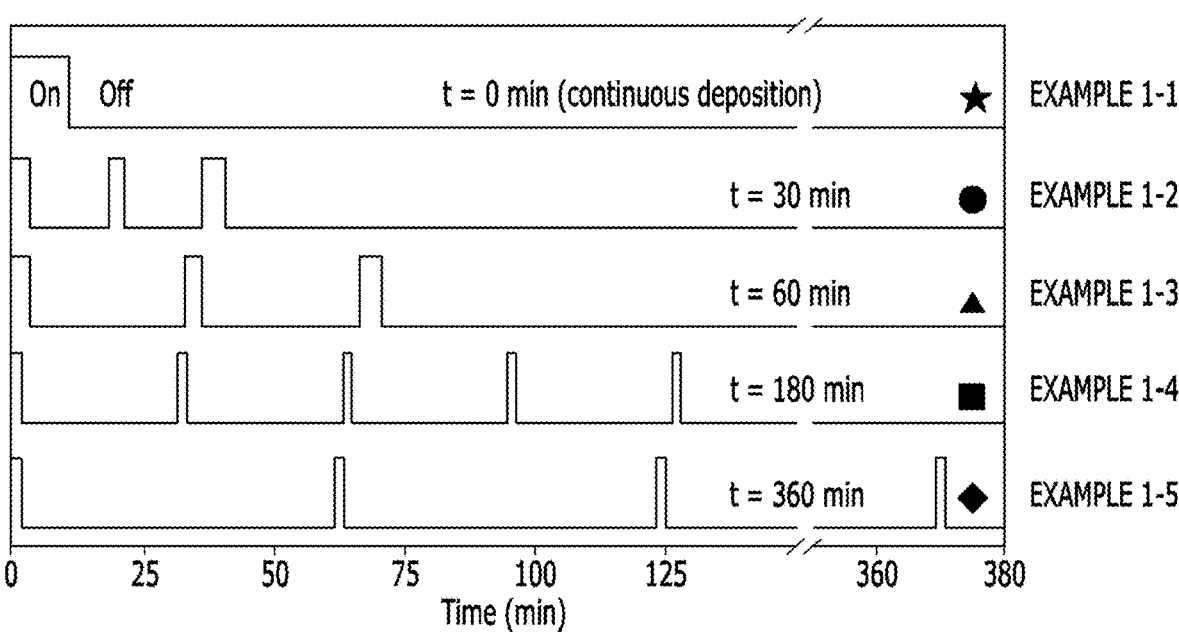
FIG. 4 is a graph illustrating five different deposition conditions to adjust an internal stress of an Ag thin film according to an exemplary embodiment of the present disclosure.

FIG. 4 is a graph illustrating five different deposition conditions to control an internal stress of an Ag thin film according to an exemplary embodiment of the present disclosure.

Referring to FIG. 4, it is confirmed that an internal stress of Example 1-1 in which a total stress release time is 0 is approximately 358 Mpa (±74 Mpa), and internal stresses of an Ag thin film in Examples 1-2 to 1-5 in which total stress release times are 30, 60, 180, and 360, respectively are reduced to 201 Mpa (±37 Mpa), 263 Mpa (±12 Mpa), 175 Mpa (±2 Mpa), and 144 Mpa (±14 Mpa), respectively. By doing this, it was confirmed that the total stress release time was controlled to control the internal stress of the metal thin film.

Figure 5:
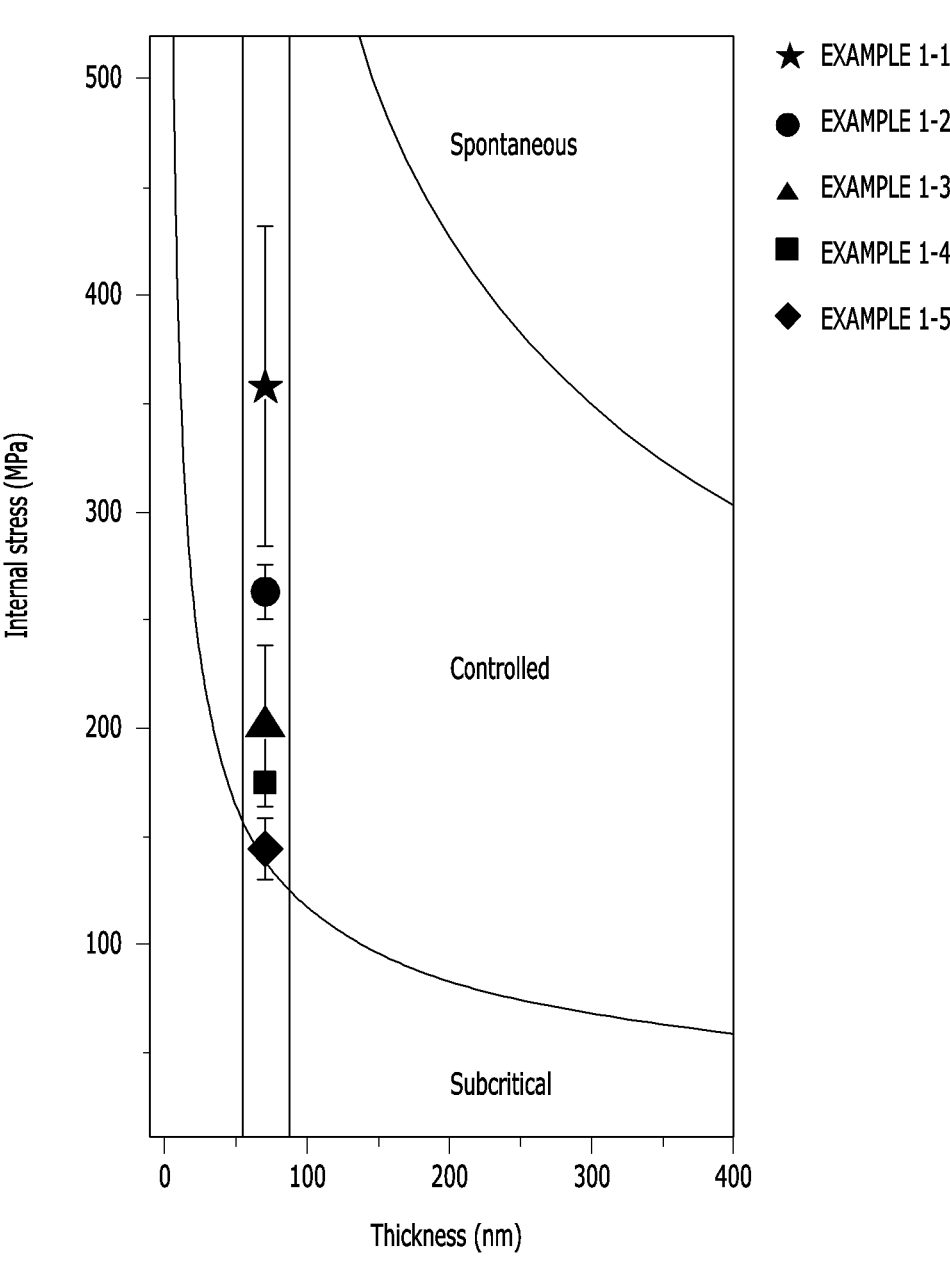
FIG. 5 is an internal stress plot according to a thickness of an Ag thin film calculated by a S—H model according to an exemplary embodiment of the present disclosure.

FIG. 5 is an internal stress plot according to a thickness of an Ag thin film calculated by a S-H model according to an exemplary embodiment of the present disclosure.

Referring to FIG. 5, it was confirmed that even though the metal thin film was deposited with the same thickness, the total stress release time was adjusted during the deposition process to control the internal stress of the metal thin film.

Next, polymethyl methacrylate (PMMA) was spin-coated on the Ag thin film at 1500 rpm for one minute to form a polymer layer (PMMA/Ag/MoS₂).

Next, after attaching the TRT onto an upper end of the PMMA/Ag/MoS₂ as a handling layer, a soft force was applied to exfoliate MoS₂ with a controlled number of layers from the bulk MoS₂.

Figure 6:
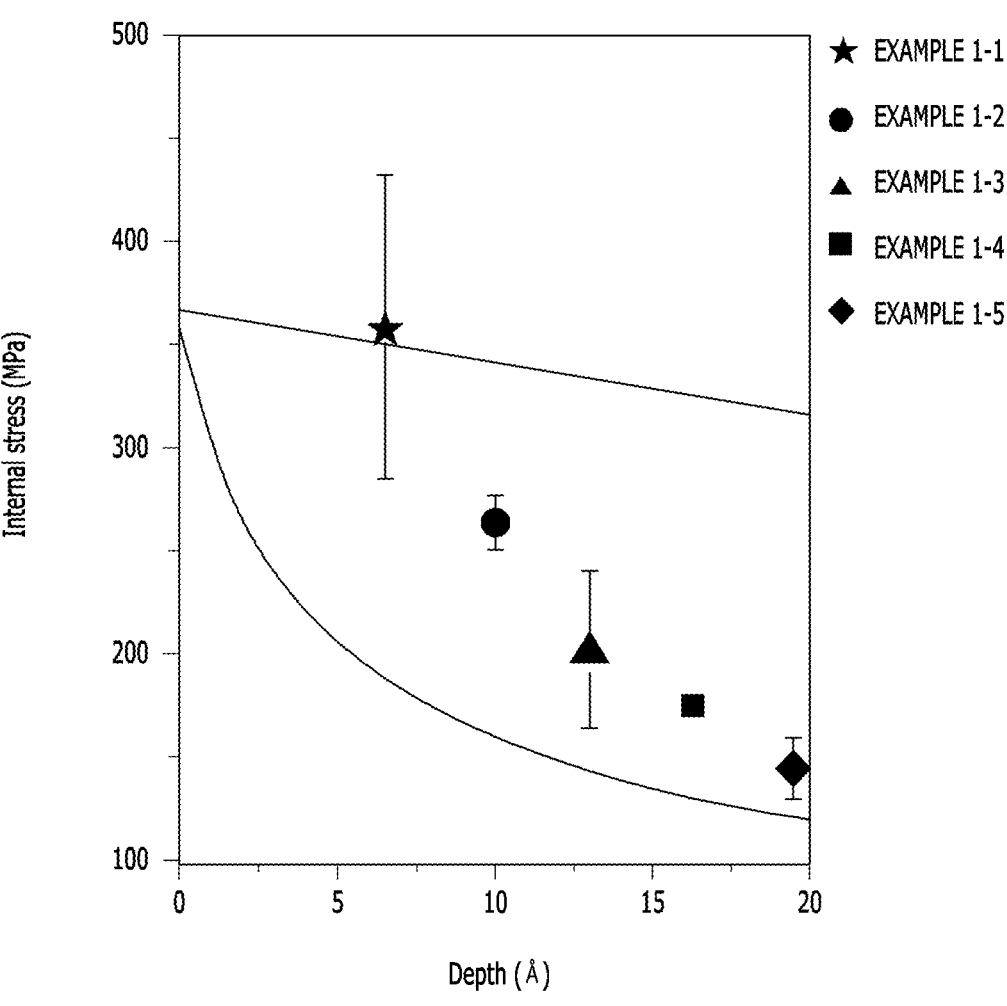
FIG. 6 is a graph illustrating a spall depth according to an internal stress of an Ag thin film according to an exemplary embodiment of the present disclosure.

FIG. 6 is a graph illustrating a spall depth according to an internal stress of an Ag thin film according to an exemplary embodiment of the present disclosure.

Referring to FIG. 6, it was confirmed that as the internal stress was reduced, the spall depth was increased. Specifically, it was confirmed that the spall depth of Example 1-1 having the largest internal stress was the smallest and the spall depth of Example 1-5 having the smallest internal stress was the largest. By doing this, it was confirmed that the number of layers of the two-dimensional material to be exfoliated was adjusted by adjusting the internal stress of the metal thin film.

Next, the MoS₂ with the controlled number of layers was transferred onto 300 nm-thick SiO₂/Si substrate and was immersed in acetone and appropriate metal etchant (Ag etchant, product No. 651818, by Sigma-Aldrich) to remove PMMA and the Ag thin film remaining on the MoS₂ with the controlled number of layers. MoS₂ with controlled number of layers was immersed in deionized water for 20 minutes to completely wash away chemical residues.

Figure 7:
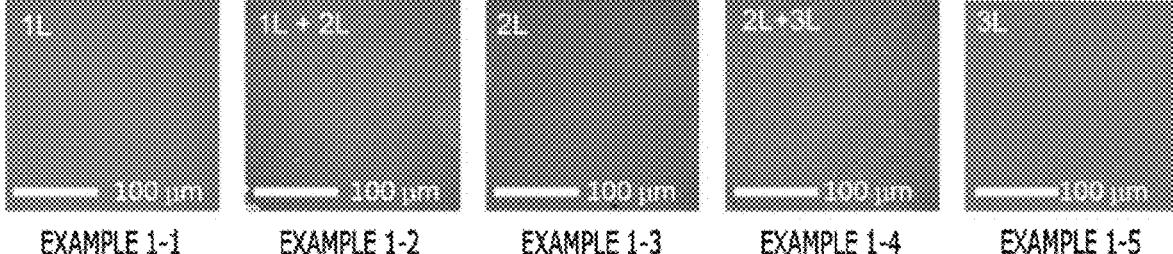
FIG. 7 is an optical microscopic image of exfoliated $MoS_2$ having different number of layers depending on an internal stress of a metal thin film according to an exemplary embodiment of the present disclosure.

FIG. 7 is an optical microscopic image of exfoliated MoS₂ having different number of layers depending on an internal stress of a metal thin film according to an exemplary embodiment of the present disclosure.

Referring to FIG. 7, it may be confirmed that as the internal stress was reduced in the order of Example 1-1 to Example 1-5, the number of MoS₂ layers to be exfoliated was increased from a single layer to double layers and triple layers.

Example 2

Prepare MoSe₂ with Controlled Number of Layers

It was prepared by the same method as in Example 1, but MoSe₂ crystal was used as a bulk material to prepare MoSe₂ with a controlled number of layers.

A deposition condition to adjust the internal stress of the Ag thin film is as represented in the following Table 2.

TABLE 2

| | Total stress release time (t) | Stress release time (A) | Interval during deposition process (B) |
|---|---|---|---|
| Example 2-1 | 0 min | 0 min | zero |
| Example 2-2 | 60 min | 30 min | Two times |
| Example 2-3 | 360 min | 60 min | Six times |

Figure 8:
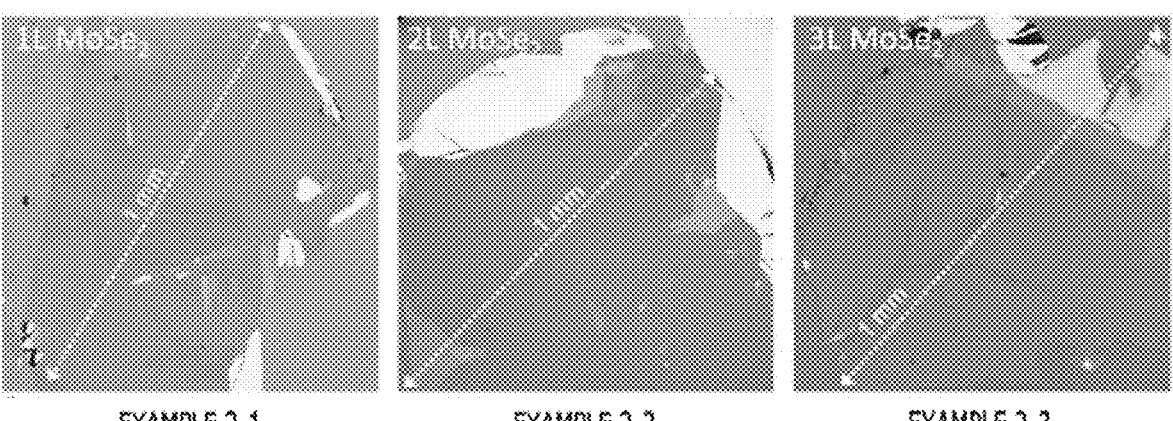
FIG. 8 is an optical microscopic image of exfoliated $MoSe_2$ having different number of layers depending on an internal stress of a metal thin film according to an exemplary embodiment of the present disclosure.

FIG. 8 is an optical microscopic image of exfoliated MoSe₂ having different number of layers depending on an internal stress of a metal thin film according to an exemplary embodiment of the present disclosure.

Referring to FIG. 8, it may be confirmed that as the internal stress is reduced in the order of Example 2-1 to Example 2-3 so that the number of MoSe₂ layers to be exfoliated is increased from a single layer to double layers and triple layers.

Example 3

Prepare WSe₂ with Controlled Number of Layers

It was prepared by the same method as in Example 1, but WSe₂ crystal was used as a bulk material to prepare WSe₂ with a controlled number of layers.

A deposition condition to adjust the internal stress of the Ag thin film is as represented in the following Table 3.

TABLE 3

| | Total stress release time (t) | Stress release time (A) | Interval during deposition process (B) |
|---|---|---|---|
| Example 3-1 | 0 min | 0 min | zero |
| Example 3-2 | 60 min | 30 min | Two times |
| Example 3-3 | 360 min | 60 min | Six times |

Figure 9:
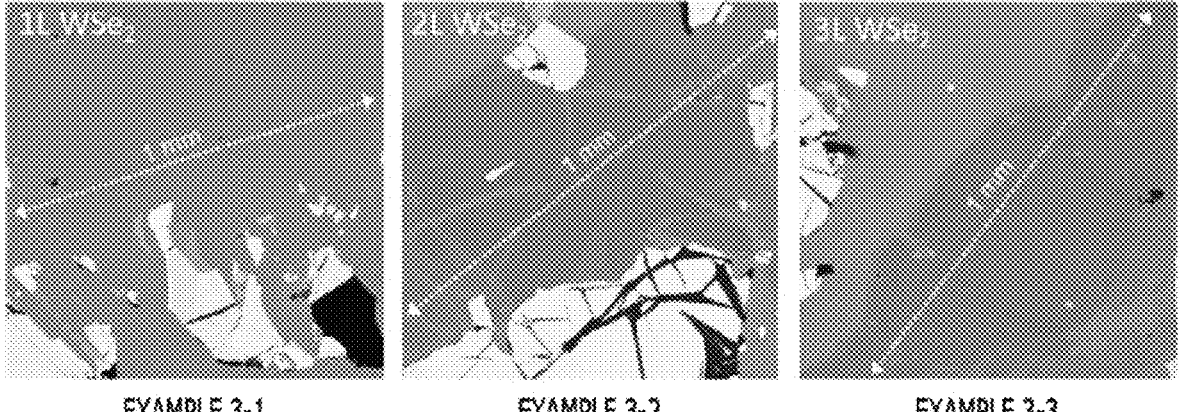
FIG. 9 is an optical microscopic image of exfoliated WSe$_2$ having different number of layers depending on an internal stress of a metal thin film according to an exemplary embodiment of the present disclosure.

FIG. 9 is an optical microscopic image of exfoliated $WSe_2$ having different number of layers depending on an internal stress of a metal thin film according to an exemplary embodiment of the present disclosure.

Referring to FIG. 9, it may be confirmed that as the internal stress is reduced in the order of Example 3-1 to Example 3-3 so that the number of $WSe_2$ layers to be exfoliated is increased from a single layer to double layers and triple layers.

Experimental Example 1

Measurement with Raman Spectroscopy

Raman Spectroscopy was used to confirm how the exfoliated $MoS_2$ was selectively separated from the $MoS_2$ crystal.

Figure 10A:
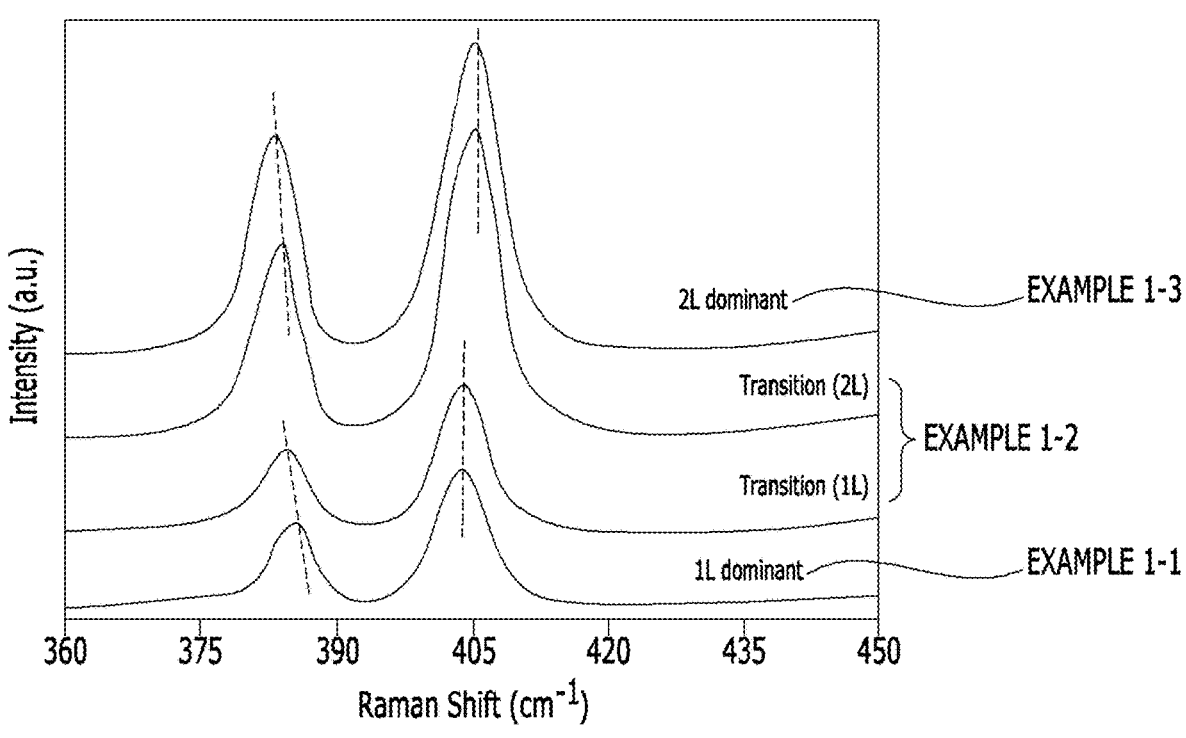
FIG. 10A is a Laman spectrum of a single layer and a double layer of exfoliated MoS$_2$ according to an exemplary embodiment of the present disclosure and FIG. 10B is a Laman map.
Figure 10B:
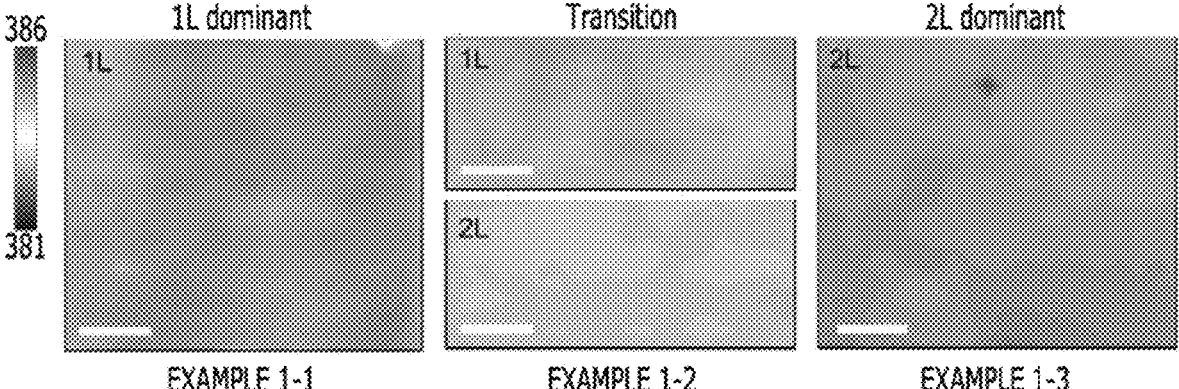

FIG. 10A is a Laman spectrum of a single layer and a double layer of exfoliated $MoS_2$ according to an exemplary embodiment of the present disclosure and FIG. 10B is a Laman map. Specifically, FIG. 10B illustrates the Raman spectrum and the Raman map of the exfoliated $MoS_2$ of Examples 1-1 to 1-3.

Referring to FIGS. 10A and 10B, a red shift of the $E^1_{2g}$ peak due to compressive strain was observed for all exfoliated $MoS_2$ samples and it was confirmed that as the spall propagation depth increased, the compressive strain level gradually decreased. When the exfoliated single layered $MoS_2$ (Example 1-1) and double layered $MoS_2$ (Example 1-3) were compared, in the transition region, $E^1_{2g}$ peaks of the single layered $MoS_2$ and the double layered $MoS_2$ were shifted by 28 $cm^{-1}$ and 32 $cm^{-1}$, which was the result matching a previous study about the exfoliation technique.

Experimental Example 2

Prepare Photo Detector Device

In order to use a strong mineral interaction of $MoS_2$ with a controlled number of layers according to the exemplary embodiment of the present disclosure, a large area van der Waals heterostructure was prepared based on a combination of $MoS_2$ according to Example 1 and graphene and a 6×6 matrix photo detector array implemented with a large area was prepared.

Figure 11:
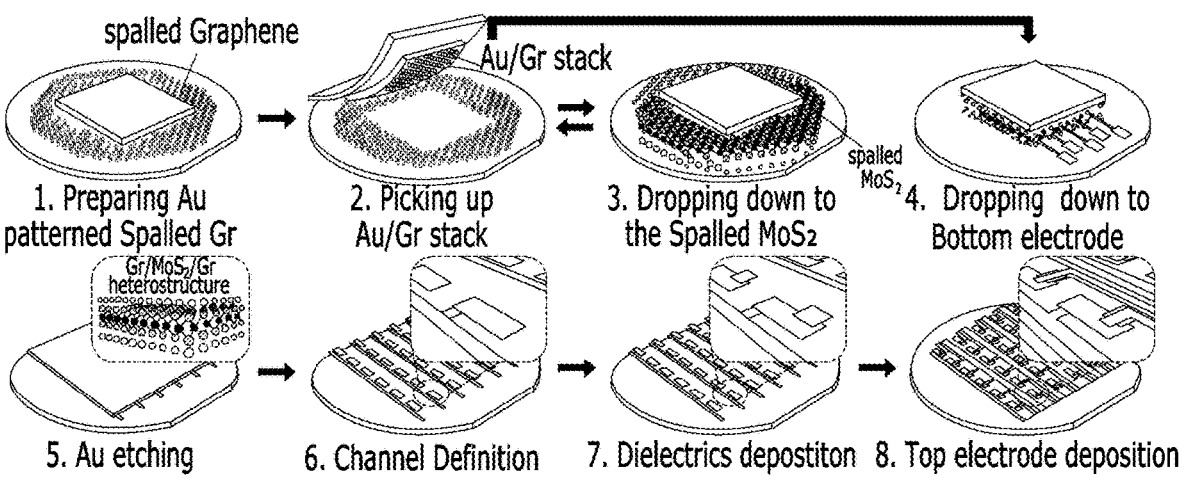
FIG. 11 is a diagram of a laminating process of a heterojunction structure of vertically laminated two-dimensional materials according to an experimental example of the present disclosure and a preparing process of a 6×6 photo detector array based on the heterojunction structure of the two-dimensional material.

FIG. 11 is a diagram of a laminating process of a heterojunction structure of vertically laminated two-dimensional materials according to an experimental example of the present disclosure and a preparing process of a 6×6 photo detector array based on the heterojunction structure of the two-dimensional material.

Referring to FIG. 11, first, a single layered graphene with a millimeter size was prepared on 300 nm-thick $SiO_2$/Si substrate and a patterned Au film was deposited on the single layered graphene Gr according to a shape and a size of the device (Au/Gr). Next, an upper graphene coated with gold was picked up by a PDMS stamp by means of a micro transferrer (NFT-01, Grabluck). Next, the $MoS_2$ of Example 1-1 was dropped down to the 300 nm-thick $SiO_2$/Si substrate. In the same manner, Au/top-graphene/$MoS_2$ was selected to be disposed on the lower single-layered graphene to prepare vertically laminated graphene/$MoS_2$/graphene (GMG) heterostructure.

The GMG based 6×6 photo detector array was prepared by a typical photolithography process. First, a lower electrode and an alignment marker were patterned by photolithography and then a metal film (Cr-5 nm and Pt-40 nm) was deposited using a thermal evaporator. Next, an Au coated GMG heterostructure was disposed in a corresponding region after the lift-off process. Next, 500 mm×500 mm size-active pixel was patterned by a photolithography process. An open region which was not defined was completely removed by an Au wet etching (Au etchant, Product No. 651818, Sigma-Aldrich) and a reactive ion etching (SF6 (40 sccm)/Ar (40 sccm), 100 W, and 1 min) process. Next, after removing the Au film on the active pixel, an upper electrode containing Cr (10 nm) and Au (60 nm) was prepared and a thin $Al_2O_3$ layer (30 nm) with a GMG heterostructure was inserted to avoid the direct contact between an upper electrode and a lower electrode.

Figure 12:
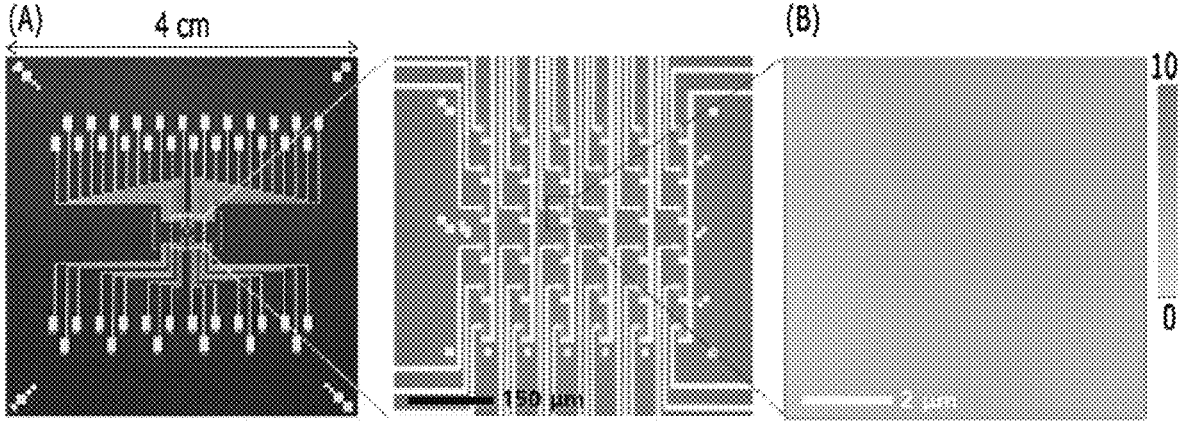
FIG. 12 shows an optical microscopic image of a detector array and a PL mapping image of a single pixel in a photo detector array. (A) of FIG. 12 is an optical microscopic image of a 6×6 photo detector array prepared on a 300 nm-SiO$_2$/Si substrate according to an experimental example of the present disclosure and (B) of FIG. 12 is a PL mapping image of a single pixel in a photo detector array of a 300-nm SiO$_2$/Si substrate.

(A) of FIG. 12 is an optical microscopic image of a 6×6 photo detector array prepared on a 300 nm-$SiO_2$/Si substrate according to an experimental example of the present disclosure and (B) of FIG. 12 is a PL mapping image of a single pixel in a photo detector array of a 300-nm $SiO_2$/Si substrate.

Referring to (A) of FIG. 12, it was confirmed that the exfoliated two-dimensional material was laminated to produce a photo detector and referring to (B) of FIG. 12, it was confirmed that an interface of the laminated two-dimensional material was clean from the PL analysis result of the prepared photo detector.

Figure 13:
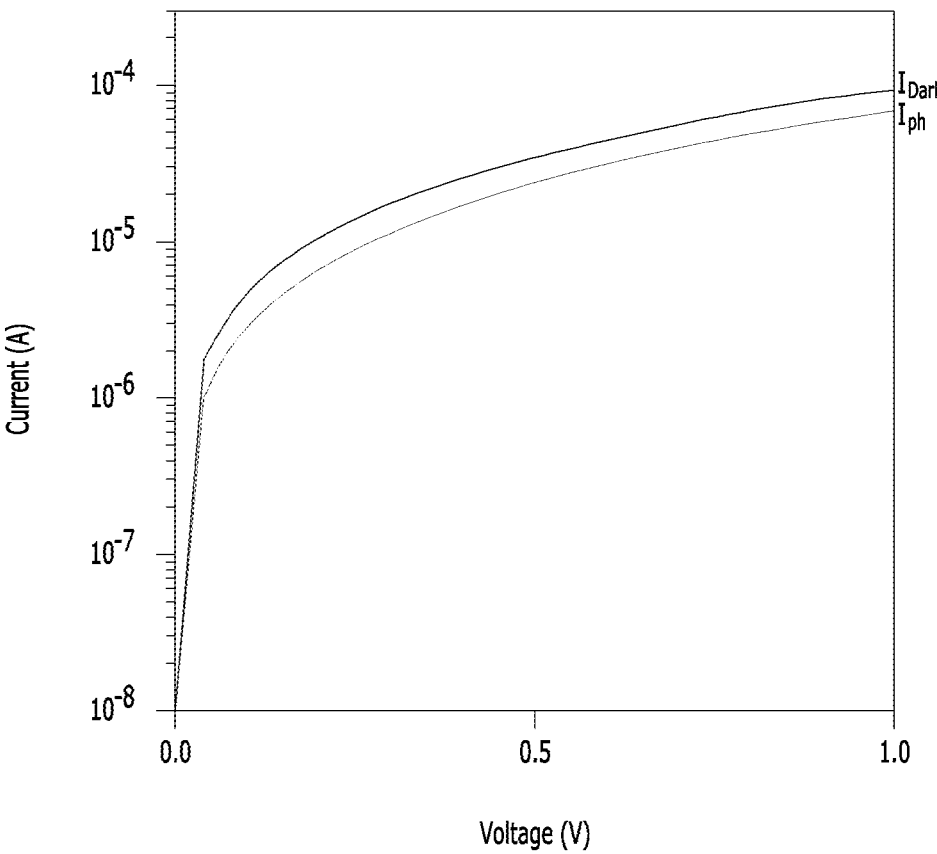
FIG. 13 is a current-voltage (I-V) curve of a photo detector measured under a condition in which no light is provided (dark) and a condition in which there is light (ph) according to an experimental example of the present disclosure.

FIG. 13 is a current-voltage (I-V) curve of a photo detector measured under a condition in which no light is provided (dark) and a condition in which there is light (ph) according to an experimental example of the present disclosure.

Referring to FIG. 13, it was confirmed that as compared with a condition in which no light was provided ($I_{dark}$), when light was provided ($I_{ph}$), the current value was dropped so that it may be used as a photo detector.

Figure 14:
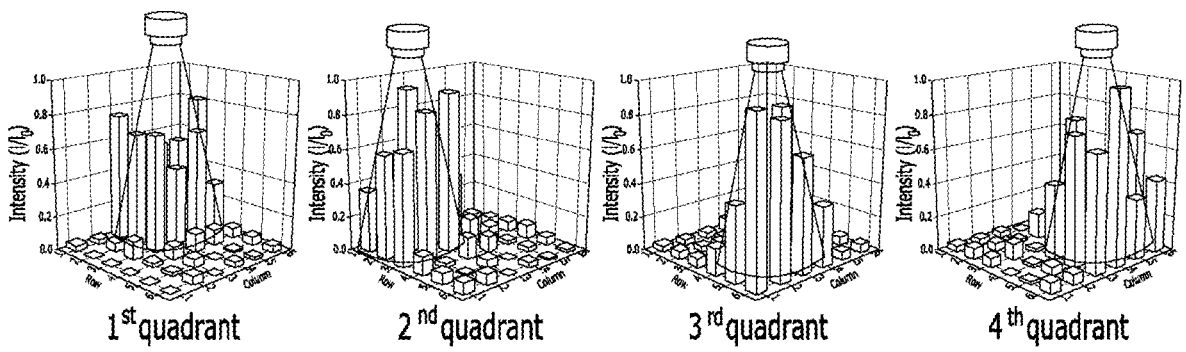
FIG. 14 is a result when laser is irradiated to various regions of a photo detector array according to an experimental example of the present disclosure.

FIG. 14 is a result when laser is irradiated to various regions of a photo detector array according to an experimental example of the present disclosure.

Referring to FIG. 14, when the laser was irradiated, light response was seen, but when the laser was not irradiated, light response was not seen.

The above-description of the present disclosure is illustrative only and it is understood by those skilled in the art that the present disclosure may be easily modified to another specific type without changing the technical spirit of an essential feature of the present disclosure. Thus, it is to be appreciated that embodiments described above are intended to be illustrative in every sense, and not restrictive. For example, each component which is described as a singular form may be divided to be implemented and similarly, components which are described as a divided form may be combined to be implemented.

The scope of the present disclosure is represented by the claims to be described below rather than the detailed description, and it is to be interpreted that the meaning and scope of the claims and all the changes or modified forms derived from the equivalents thereof come within the scope of the present disclosure.

What is claimed is:

1. A preparing method of a two-dimensional material with a controlled number of layers comprising:

depositing a metal thin film on a surface of a bulk material;

exfoliating a two-dimensional material from the surface of the bulk material together with the metal thin film; and transferring the two-dimensional material onto a substrate, wherein the number of layers of the two-dimensional material to be exfoliated is controlled by controlling an internal stress of the metal thin film, wherein the internal stress $\sigma_f$ of the metal thin film is represented by the following Equation 1 and when a total accumulated strain energy $U_{Total}$ represented by the following Equation 2 reaches a binding energy $\gamma$ between the two-dimensional materials, the two-dimensional material is exfoliated, $$\sigma_f = \sqrt{\frac{\gamma}{U_{Total}}}$$ [Equation 1]

wherein in Equation 1, $\gamma$ is a binding energy of a two-dimensional material and $U_{Total}$ is a total accumulated strain energy, $$U_{Total} = \frac{(1 - v_f)}{2Y_f} t_f \sigma_f^2 +$$
$$\frac{(1 - v_s)}{2Y_s} \frac{t_f^2}{t_s} \sigma_f^2 \left[ 12 \left( \frac{d_{spall}}{t_s} \right)^3 - 24 \left( \frac{d_{spall}}{t_s} \right)^2 + 16 \left( \frac{d_{spall}}{t_s} \right) \right]$$ [Equation 2]

wherein in Equation 2, $v_s$ and $v_f$ are Poisson's ratios of a bulk material and a metal thin film, respectively, $Y_s$ and $Y_f$ are Young's modulus of a bulk material and a metal thin film, respectively, $t_s$ and $t_f$ are thicknesses of a bulk material and a metal thin film, respectively, and $d_{spall}$ is a spall depth.

2. The preparing method of a two-dimensional material with a controlled number of layers according to claim 1, wherein as the internal stress of the metal thin film is reduced, the number of layers of the two-dimensional material to be exfoliated is increased.

3. The preparing method of a two-dimensional material with a controlled number of layers according to claim 1, further comprising:

removing the metal thin film.

4. The preparing method of a two-dimensional material with a controlled number of layers according to claim 3, wherein the removing of the metal thin film is performed by impregnating the metal thin film into a metal etchant.

5. The preparing method of a two-dimensional material with a controlled number of layers according to claim 1, wherein the depositing of the metal thin film is performed by a method selected from the group consisting of E-beam evaporation, thermal evaporation, vacuum thermal evaporation, plasma deposition, sputtering, atomic layer deposition (ALD), chemical vapor deposition (CVD), physical vapor deposition (PVD), and combinations thereof.

6. The preparing method of a two-dimensional material with a controlled number of layers according to claim 1, wherein the metal includes one selected from the group consisting of Ag, Au, Cu, Pd, and combinations thereof.

7. The preparing method of a two-dimensional material with a controlled number of layers according to claim 1, wherein the two-dimensional material includes one selected from the group consisting of transition metal chalcogenide, graphene, fluorographene, graphene oxide, hexagonal boron nitride (h-BN), boron carbon nitride (BCN), black phosphorus, and combinations thereof.

8. The preparing method of a two-dimensional material with a controlled number of layers according to claim 7, wherein the transition metal chalcogenide includes a material denoted by the following Chemical Formula 1, $$MX_2$$ [Chemical Formula 1]

wherein in the above Chemical Formula 1, M is a transition metal selected from Mo, W, Te, Re, V, Nb, Ta, Ti, Zr, Hf, Co, Rh, Ir, Ni, Pd, or Pt and X is a chalcogenide element selected from S, Se, or Te.

9. The preparing method of a two-dimensional material with a controlled number of layers according to claim 1, wherein the exfoliation is performed using a thermal release tape (TRT).

* * * * *